(12) United States Patent
Chin

(10) Patent No.: US 7,119,422 B2
(45) Date of Patent: Oct. 10, 2006

(54) SOLID-STATE SEMICONDUCTOR LIGHT EMITTING DEVICE

(75) Inventor: Yuan-Cheng Chin, Hsintien (TW)

(73) Assignee: Unity Opto Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/986,857

(22) Filed: Nov. 15, 2004

(65) Prior Publication Data
US 2006/0103012 A1    May 18, 2006

(51) Int. Cl.
*H01L 23/34* (2006.01)

(52) U.S. Cl. ............... 257/666; 257/712; 257/E33.062; 362/294

(58) Field of Classification Search ............... 257/666, 257/712; 362/294
See application file for complete search history.

(56) References Cited

U.S. PATENT DOCUMENTS

| | | | |
|---|---|---|---|
| 6,517,218 B1 * | 2/2003 | Hochstein | 362/294 |
| 6,621,169 B1 | 9/2003 | Kikuma et al. | 257/780 |
| 2002/0027295 A1 | 3/2002 | Kikuma et al. | 257/780 |
| 2002/0050376 A1 | 5/2002 | Hogerl | 174/52.1 |

FOREIGN PATENT DOCUMENTS

JP    2002151644    5/2002

* cited by examiner

*Primary Examiner*—Roy Potter
(74) *Attorney, Agent, or Firm*—Troxell Law Office, PLLC

(57) ABSTRACT

A solid-state semiconductor light emitting device is disclosed. A heat sink that comprises a receiving cup for receiving a chip is provided. A leadframe that comprises a connection base is mounted above the heat sink, wherein the chip is connected to the leadframe via a metal wire and a resin or silicone is applied to cover all of them so as to form the a light emitting device that emits light. In the leadframe, two holders that include two top sides on their two top portions are opposite to one another, and a holder having holes is mounted between these two top sides. The holder having the holes is connected to one of these two opposite holders. A plastic material is applied to mold the three holders into the connection base for receiving the receiving cup of the heat sink. As a result, the heat sink provides with good heat-dissipating efficacy and each holder of the leadframe also provides with heat-dissipating efficacy and enhances connection stability as well.

5 Claims, 6 Drawing Sheets

SOLID-STATE SEMICONDUCTOR LIGHT EMITTING DEVICE

FIELD OF THE INVENTION

The present invention relates to a solid-state semiconductor light emitting device that provides with good heat-dissipating efficacy and enhances connection stability, and more particularly, to a solid-state semiconductor light emitting device that is suitable for a light emitting diode (LED) or the like.

BACKGROUND OF THE INVENTION

In general, photometric efficiency of an LED is inversely proportional to the junction temperature of the LED. A major concern of the LED package designer is keeping the die cool to be lower than the junction temperature. In the conventional LED, the chip is mounted at the base of a concave cup (i.e. optical cavity) of one conducting wire and connected to another conducting wire via a connection wire. Accordingly, the packaged die will be damaged easily as a result of thermal stress.

In view of above conventional drawbacks, U.S. Pat. No. 6,274,924 entitled "surface mountable led package" discloses a structure, as shown in FIG. 1. In this structure, a heat sink 10 includes an optional reflective cup 14. The insert-molded leadframe 12 is a filled plastic material molded around a metal frame that provides an electrical path. The light emitting diode die 16 is mounted indirectly via a heat-conducting subbracket 18 to the heat sink 10. Connection wires extend from the LED 16 and the heat-conducting subbracket 18 to metal wires on leadframe 12 that are electrically and thermally isolated from the heat sink 10. An optical lens 20 may be added by mounting a pre-molded thermoplastic lens and an encapsulant or by casting epoxy to cover the LED.

Although the above structure can separate electricity and heat from one another to prevent the die from heat, its composition is very complicated. Accordingly, the present inventor has been made diligent studies with a quiet mind to design and fabricate a solid-state semiconductor light emitting device that provides with simplified composition in which electricity and heat are not separated from one another. The heat-dissipating area is increased by means of a plurality of holders of a leadframe in addition to the use of the heat sink for dissipating heat. Holders are also applied to enhance connection stability between the solid-state semiconductor light emitting device and a circuit board. This solid-state semiconductor light emitting device is provided for the public in accordance with motivations of the present invention.

SUMMARY OF THE INVENTION

The main purpose of the present invention is to provide a solid-state semiconductor light emitting device that includes simplified composition, wherein the electricity and the heat are not separated from one another.

Another purpose of the present invention is to provide a solid-state semiconductor light emitting device that increases heat-dissipating area and enhances connection stability.

In order to achieve the aforementioned purposes, the present invention comprises a heat sink, a chip, a leadframe, and a resin or silicone that covers all of them, wherein a receiving cup is mounted on the center portion of the heat sink for receiving the chip. In addition, the chip is connected to the heat sink via a heat-conducting bracket. In the leadframe, two holders that include two top sides on their two top portions are opposite to one another, and a holder that includes holes on a center portion thereof is mounted between these two top sides. The holder having the holes on the center portion thereof is connected to one of these two opposite holders in a random position. These three holders are connected to one another by using a plastic material. The connection base is formed by molding the plastic material. The receiving cup of the heat sink is received by the connection base of the leadframe and the chip is connected to the leadframe via a metal wire. Next, the resin or silicone covers all of them so as to complete a light emitting diode that emits light. As a result, the heat sink provides with good heat-dissipating efficacy and each holder of the leadframe also provides with heat-dissipating efficacy and enhances the connection stability as well.

The other features and preferred embodiments of the present invention will now be described with reference to the accompanying drawings.

DETAILED DESCRIPTION OF THE PREFERRED EMBODIMENT

Figure 1:
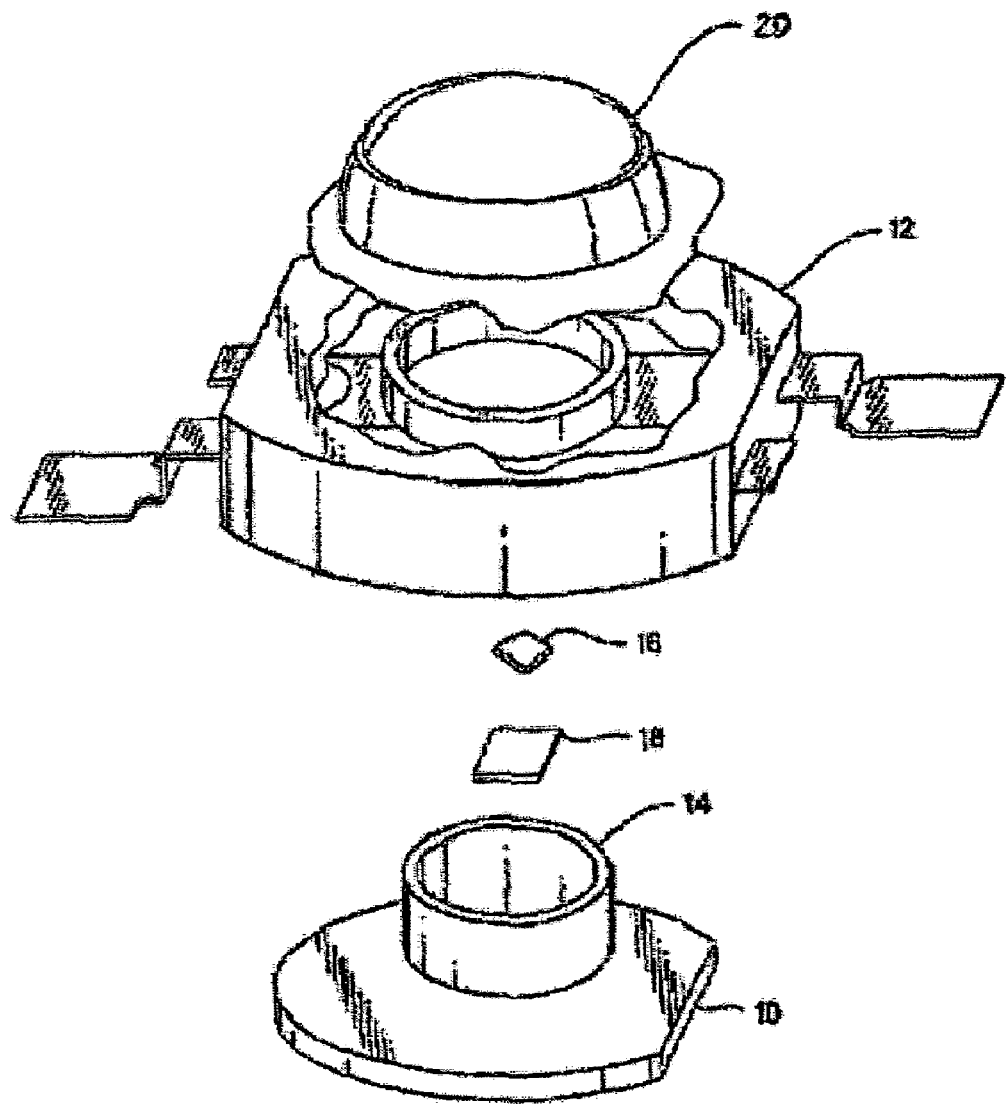
FIG. 1 is a perspective, decomposed view showing devices of a conventional light emitting diode.
Figure 2:
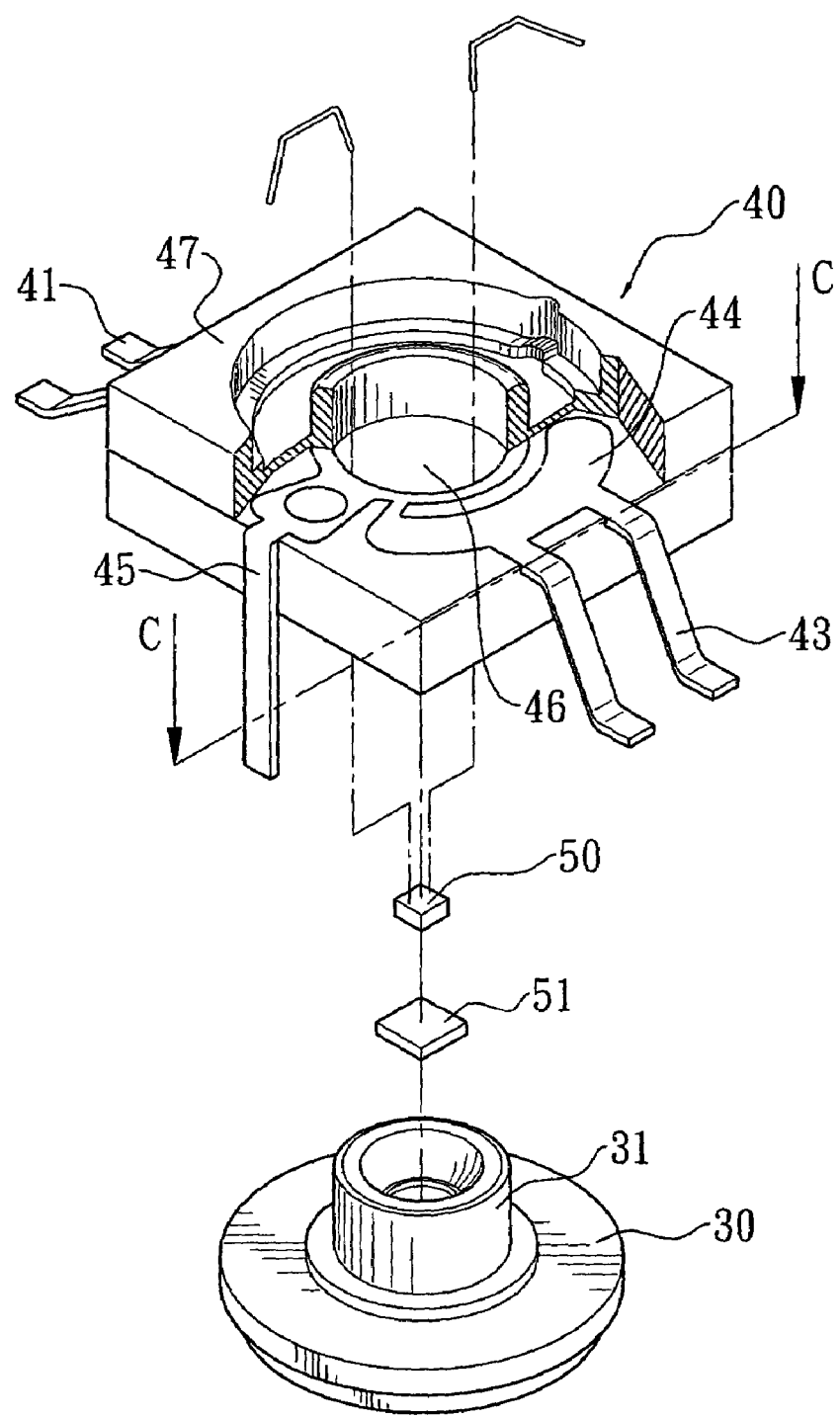
FIG. 2 is a perspective, decomposed view showing a preferred embodiment of the present invention.
Figure 3:
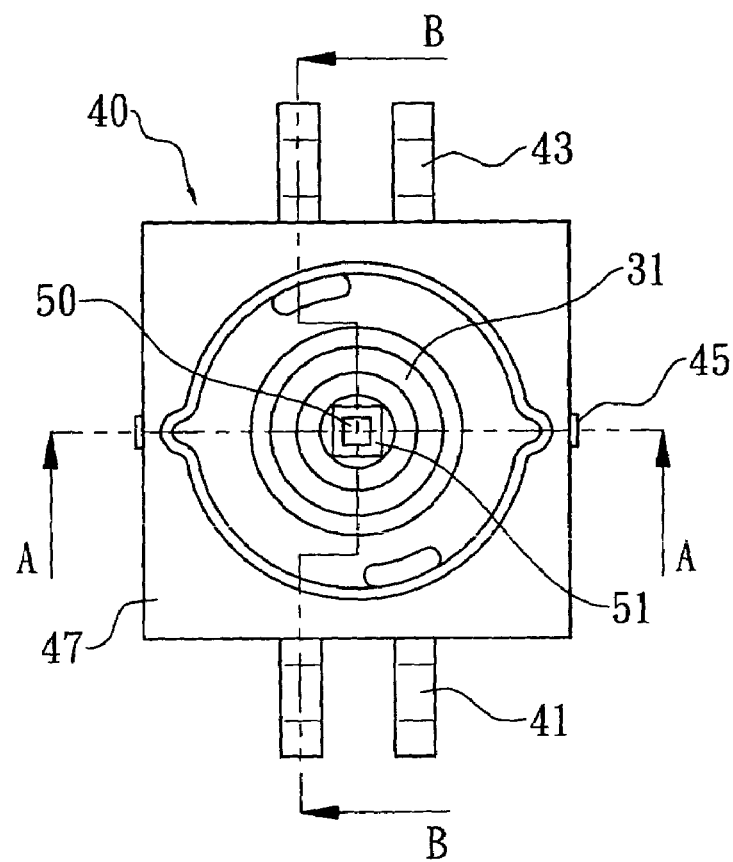
FIG. 3 is a top view shows a heat sink of the present invention connects with a leadframe.

Referring to FIG. 1 and FIG. 2, the present invention mainly comprises a heat sink 30, a leadframe 40, a chip 50, and a heat-conducting bracket 51. Next, all of them are covered by resin or silicone (not shown) to form a light emitting diode. The heat sink 30 is made of a heat-conducting material selected from the group consisting of pure materials, compounds, and composites of copper, silicon, aluminum, molybdenum, aluminum oxide, aluminum nitride, and beryllium. Alternatively, composites of molybdenum-copper and tungsten-copper may be used. Receiving cup 31 projects upwardly from the center portion of the heat sink 30 for receiving the optional heat-conducting bracket 51 and the chip 50.

Figure 6:
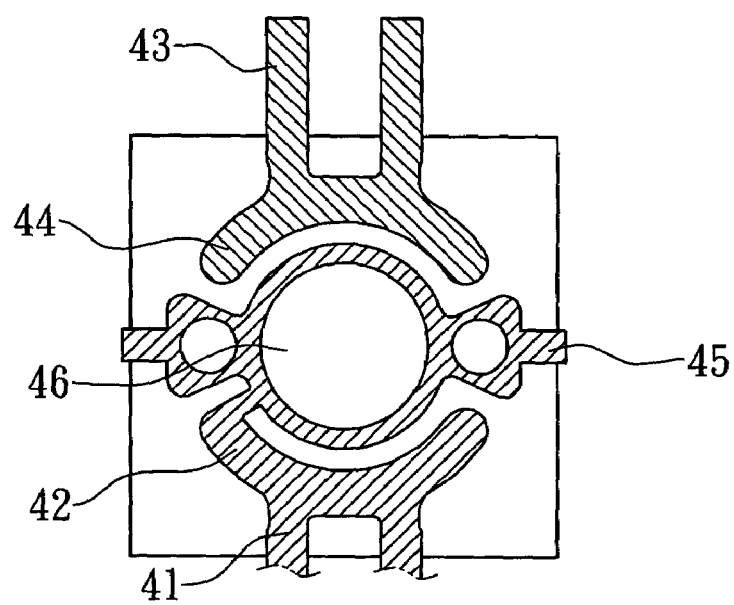
FIG. 6 is a cross-section view taken along the line C—C of FIG. 2.

The leadframe 40 is formed by arranging a first holder 41, a second holder 43, and a third holder 45, and coupling them with a connection base 47, which is made of a molded plastic material. As shown in FIG. 6, the first holder 41 and the second holder 43 are identical in structure, wherein each of them have two legs, and cambered sides 42 and 44 that respectively connect these two legs are mounted on the top portions thereof. The cambered sides 42 and 44 of the first holder 41 and the second holder 43, which are opposite to one another, are mounted on the mold. In addition, the third holder 45 on which center holes 46 are formed is arranged on the mold in a position between these two cambered sides 42 and 44. At the same time, either the first holder 41 or the second holder 43 is connected to the third holder 45 in a random position. A plurality of protrusions are mounted on the mold such that the leadframe 40 that includes the connection base 47 is completed when the plastic material is molded, wherein a plurality of through holes are mounted on the connection base 47 for exposing the holders 41, 43, and 45.

Figure 4:
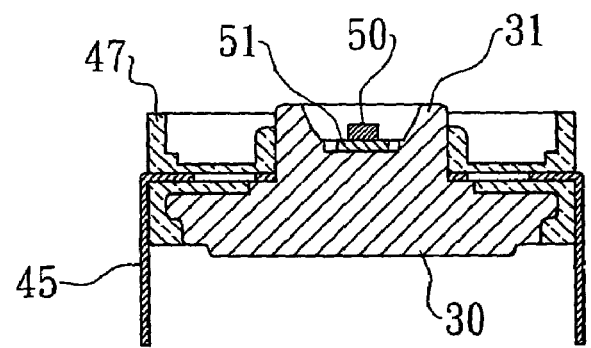
FIG. 4 is a cross-section view taken along the line A—A of FIG. 3.
Figure 5:
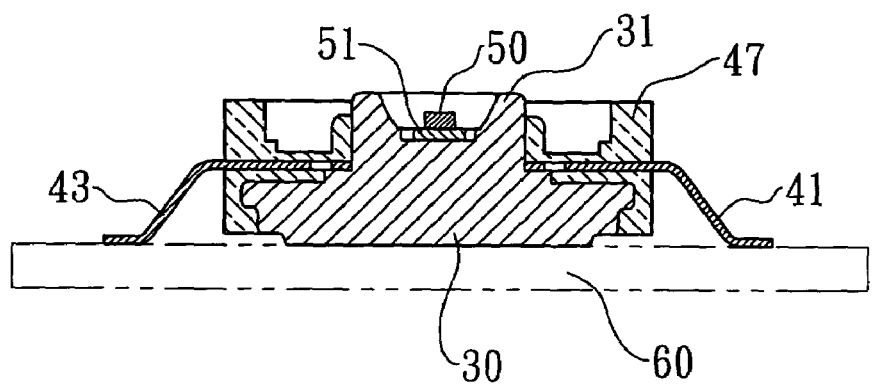
FIG. 5 is a cross-section view taken along the line B—B of FIG. 3.
Figure 7A:
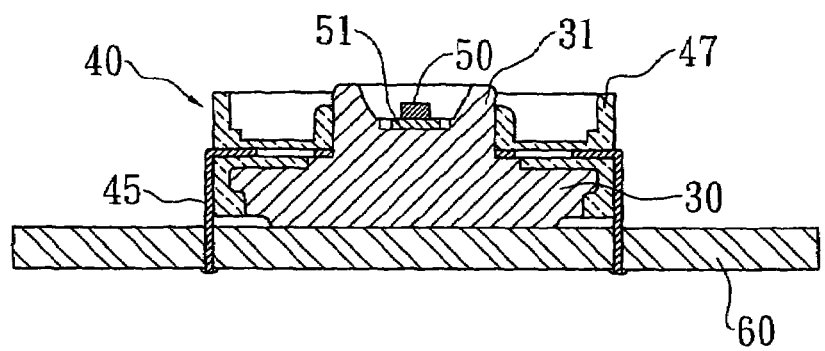
FIG. 7a through FIG. 7c shows illustrations of the present invention that couples with a circuit board.
Figure 7B:
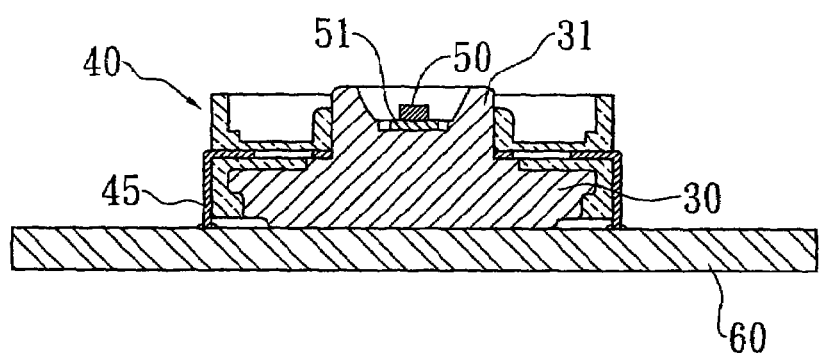
Figure 7C:
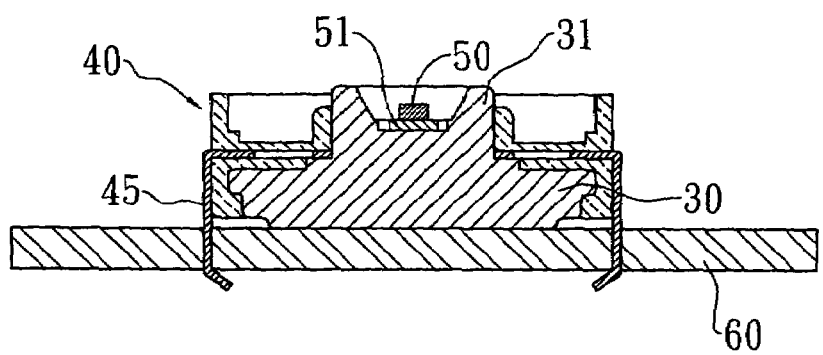

Referring to FIG. 4 and FIG. 5, during the connecting operation, the heat sink 30 plugs into the leadframe 40 in a bottom-up direction so as to enable the receiving cup 31 to plug into the holes 46 of the third holder 45. The chip 50 that mounts inside the receiving cup 31 is connected to the first holder 41 and the second holder 43 or the third holder 45 via a metal wire by using the preformed through holes on the connection base 47. In addition, the resin or silicone (not shown) covers all of the heat sink 30, the leadframe 40, the chip 50, and the metal wire to compete the manufacture of the light emitting diode. When the light emitting diode is coupled with a circuit board 60, the third holder 45 on front and rear sides enhances the connection stability besides the use of the first holder 41 and the second holder 43 on right and left sides for connection. When the third holder 45 couples with the circuit board 60, the third holder 45 may welds on the surface of the circuit board 60 or passes through the circuit board 60 for directly welding with the circuit board 60. Besides, the terminals of the third holder 45 may be bent when the third holder 45 passes through the circuit board 60, as shown in FIGS. 7a, 7b, and 7c.

Figure 8:
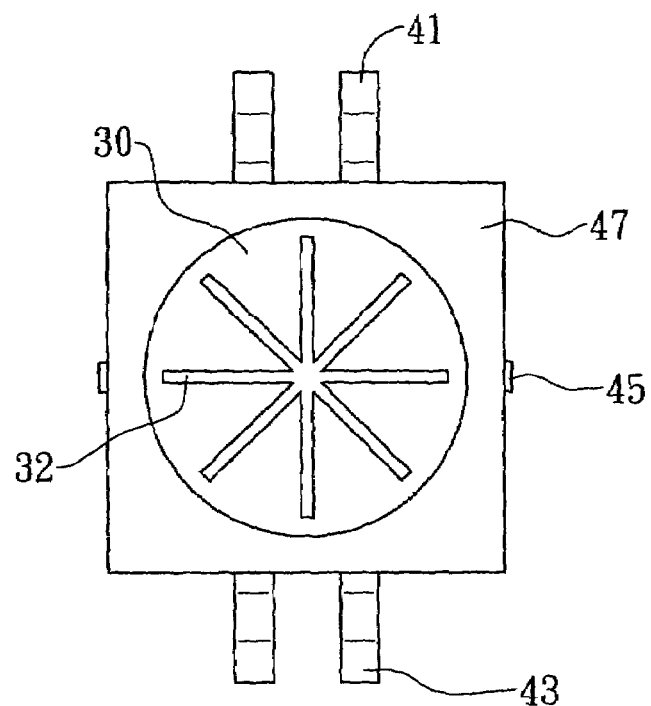
FIG. 8 is a bottom view showing the preferred embodiment of the present invention.
Figure 9:
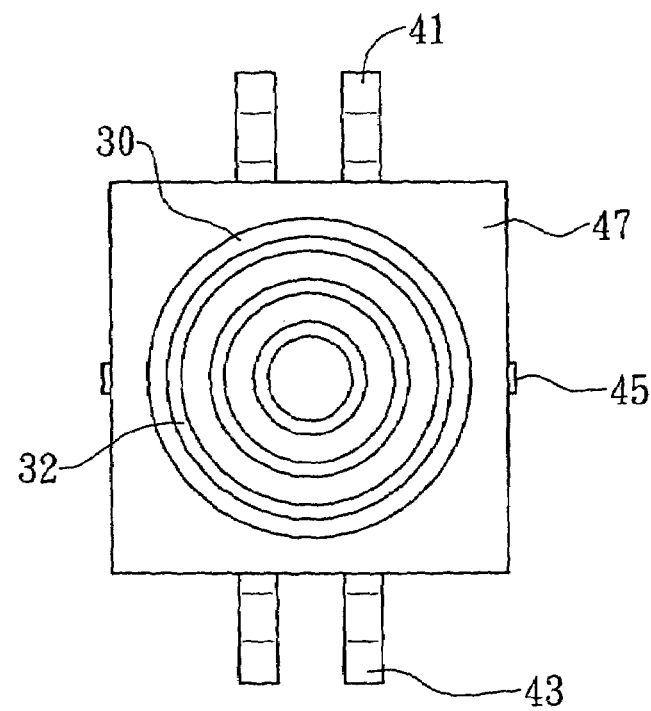
FIG. 9 is a bottom view showing another illustration of the preferred embodiment of the present invention.

If it is electrified for use, the heat generated by the chip 50 and the metal wire will be released through the heat-conducting bracket 51 and the heat sink 30. As shown in FIG. 9, a protrusion 32, which is arranged in the form of homocentric circles, is mounted on the bottom portion of the heat sink 30 so as to increase the temperature gradient of surface. Referring to FIG. 8, a protrusion 32 that radiates from the center of a circle is mounted on the bottom portion of the heat sink 30. It is demonstrated from the experiments that the protrusion 32 can increase the surface temperature gradient. As a result, the heat sink is able to provide the best heat-dissipating efficacy.

According to the above description, it is apparent that the apparatus of the present invention comprises the following advantages:

1. It is able to simplify composition, and the good heat-dissipating efficacy can be achieved even if the electricity and the heat are not separated from one another. Thus, the efficacy of the chip is not influenced.

2. By using the holders of the leadframe, its connection can be steadier and the surface area for dissipating the heat can be increased.

3. The third holder mounted inside the leadframe can be cut off according to customer's requirements.

However, the above description merely illustrates the preferred embodiments of the present invention, and the applicable scope of the present invention is not limited hereto. Any obvious modification and revision made by a person skilled in the art are included within the spirit and scope of the present invention.

As described above, the present invention is able to achieve the expected purpose of the present invention by providing with a solid-state semiconductor light emitting device. The application that complies with utility is therefore submitted for a patent.

The invention claimed is:

1. A solid-state semiconductor light emitting device comprising:
   a heat sink having a receiving cup that projects from a center of said heat sink for receiving a chip; and
   a leadframe, in which two holders having two top sides on two top portions thereof are opposite to one another and a holder having holes is mounted between said two top sides, wherein said holder having said holes is connected to one of said two opposite holders, and a plastic material is applied to mold said three holders into a connection base for receiving said receiving cup of said heat sink;
   thereby said chip is connected to said leadframe via a metal wire and a resin or silicone are applied to cover all of them so as to form said solid-state semiconductor light emitting device that has good heat-dissipating efficacy and can enhance connection stability,
   wherein a plurality of through holes are mounted on said connection base for exposing said three holders.

2. A solid-state semiconductor light emitting device comprising:
   a heat sink having a receiving cup that projects from a center of said heat sink for receiving a chip; and
   a leadframe, in which two holders having two top sides on two top portions thereof are opposite to one another and a holder having holes is mounted between said two top sides, wherein said holder having said holes is connected to one of said two opposite holders, and a plastic material is applied to mold said three holders into a connection base for receiving said receiving cup of said heat sink;
   thereby said chip is connected to said leadframe via a metal wire and a resin or silicone are applied to cover all of them so as to form said solid-state semiconductor light emitting device that has good heat-dissipating efficacy and can enhance connection stability,
   wherein a protrusion is mounted on said bottom surface of said heat sink.

3. The solid-state semiconductor light emitting device of claim 2, wherein said protrusion is in the form of radiation.

4. The solid-state semiconductor light emitting device of claim 2, wherein said protrusion is arranged in the form of homocentric circles.

5. A solid-state semiconductor light emitting device comprising:
   a heat sink having a receiving cup that projects from a center of said heat sink for receiving a chip; and
   a leadframe, in which two holders having two top sides on two top portions thereof are opposite to one another and a holder having holes is mounted between said two top sides, wherein said holder having said holes is connected to one of said two opposite holders, and a plastic material is applied to mold said three holders into a connection base for receiving said receiving cup of said heat sink;
   thereby said chip is connected to said leadframe via a metal wire and a resin or silicone are applied to cover all of them so as to form said solid-state semiconductor light emitting device that has good heat-dissipating efficacy and can enhance connection stability,
   wherein said holder having said holes is connected to one of said two opposite holders in a random position.

* * * * *